METHOD FOR DEPOSITING INSULATING FILMS OF SILICON NITRIDE AND ALUMINUM NITRIDE

Filed May 15, 1968

INVENTOR.
WILLIAM B. PENNEBAKER
BY
S. P. Tedesco
ATTORNEY 3,600,218
METHOD FOR DEPOSITING INSULATING FILMS OF SILICON NITRIDE AND ALUMINUM NITRIDE William B. Pennebaker, Carmel, N.Y., assignor to International Business Machines Corporation, Armonk, N.Y.

Continuation-in-part of application Ser. No. 494,789, Oct. 11, 1965. This application May 15, 1968, Ser. No. 729,280
Int. Cl. C23c *11/14, 15/07*
U.S. Cl. 117—93.1GD 11 Claims

ABSTRACT OF THE DISCLOSURE

A substrate and source, of silicon (Si) or aluminum (Al), are positioned within a nitrogen-containing atmosphere of less than 20 microns. Radio-frequency energy is applied across the substrate and source to generate a plasma containing source material, and nitrogen which react so as to deposit a thin insulating film, e.g., of silicon nitride ($Si_3N_4$) or aluminum nitride (AlN), respectively, on the substrate surface. Preferably, the substrate is maintained in excess of 300° C. during the deposition process.

This application is a continuation-in-part of patent application Ser. No. 494,789, filed on Oct. 11, 1965, now Pat. No. 3,419,761, and assigned to a common assignee.

BACKGROUND OF THE INVENTION

Field of the invention

The present invention relates to a method for depositing insulating films and to solid state electrical devices incorporating such films. More particularly, the invention is concerned with the deposition of films of silicon nitride ($Si_3N_4$) and aluminum nitride (AlN) having excellent insulating properties and the use of such films in solid state electrical devices.

Description of the prior art

In the production of solid state electrical devices, it is well known that insulating layers may be deposited as integral layers of the devices by sputtering techniques. The insulating materials employed have generally been silicon oxide and dioxide and various metal oxides, such as alumina. During the deposition of such films by sputtering, it has been found that negative oxygen ions are formed which are accelerated to the substrate. These ions may cause damage when they impinge on the substrate. This results in imperfect insulating films which may affect the reliability and electrical characteristics of the resulting device.

Moreover, it has been found that most oxygen containing insulating films are not resistant to certain chemical etchants. Thus, during selective etching to provide access for contact formation, problems have been encountered in achieving close control of the etching procedure.

SUMMARY OF THE INVENTION

Therefore, the primary object of the present invention is to provide a method for producing excellent insulating thin films which are continuous and relatively free from surface imperfections and which are generally nonreactive in the presence of conventional chemical etchants. A further object of the invention is to provide high quality silicon nitride ($Si_3N_4$) insulating films and aluminum nitride (AlN) insulating films by a reactive sputtering process practiced in a nitrogen-containing atmosphere of less than 20 microns which are relatively free from surface defects and to provide solid state electrical devices incorporating such films.

The manner in which the foregoing objectives and many other highly desirable advantages are achieved in accordance with the present invention will be more fully apparent in the light of the following detailed description. The description is of a preferred embodiment and illustrates the best mode that has been contemplated for carrying out the invention.

Suitable apparatus for carrying out the process of the invention and producing the desired products is illustrated in the accompanying drawing. An illustration of the application of the insulating films of the present invention in the production of solid state electric devices is also set forth in the drawing.

The foregoing and other objects, features, and advantages of the invention will be apparent from the following more particular description of a preferred embodiment of the invention, as illustrated in the accompanying drawing.

According to the invention, it has now been found that excellent insulating films for use in solid state electrical devices, such as integrated circuits, may be formed by the deposition of thin films of silicon nitride and, also, aluminum nitride by reactive radio frequency sputtering. The resulting films provide good insulating layers in the fabrication of solid state electrical devices, since they exhibit a high breakdown voltage and low leakage current. In particular, the films are relatively free from surface defects, as compared with the conventional oxygen-containing insulating layers, and are also more resistant to attack by chemical etchants.

The insulating films of the present invention may be deposited on any suitable substrate, but are of particular value as insulating layers on semiconductor substrates. The manner in which the silicon nitride and, also, aluminum nitride films are deposited onto such substrates will be better understood by reference to the accompanying drawing.

DESCRIPTION OF THE INVENTION

Figure 1:
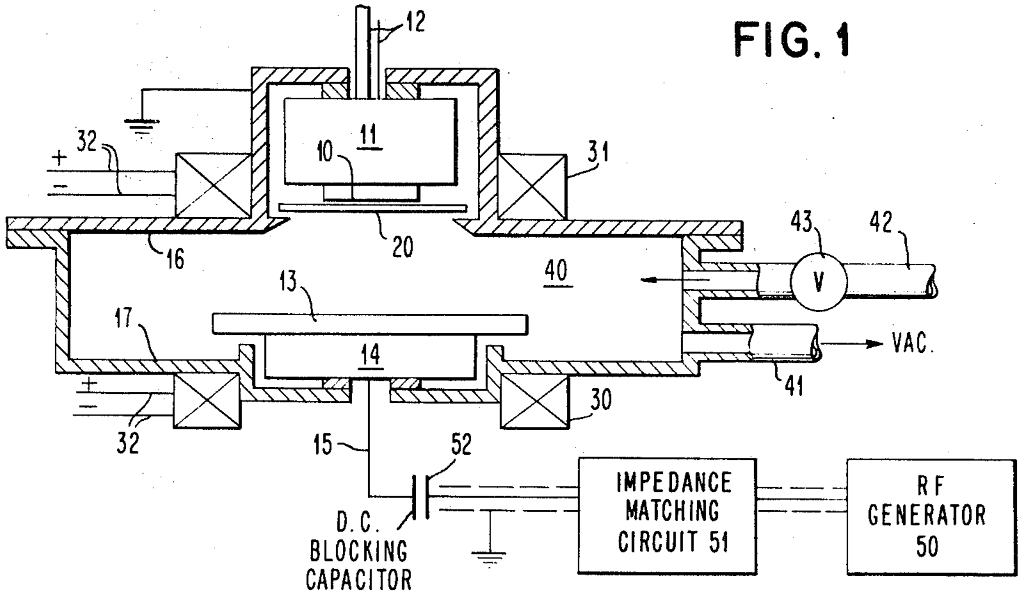
FIG. 1 is a generally schematic, side-sectional view of a sputtering system for use in practicing the invention.

As shown in FIG. 1, substrate 10 is attached in any suitable manner, as by clamping, to substrate holder 11. Leads 12 connect holder 11 to electrical and thermal controls for maintaining the temperature of the substrate holder and substrate at desired levels.

To deposit a silicon nitride film, a source 13 of silicon material is employed as the cathode and rests on a metal field plate 14 which is connected by electrical lead 15 to a source of radio frequency power. Source 13 would be formed of aluminum when an aluminum nitride film is to be deposited. Source 13 and substrate 10 can be separated, for example, by a distance of approximately 1 inch.

Shields 16 and 17 surrounding the substrate and cathode, respectively, are connected to ground so as to function as anodes.

A removable shutter 20 is positioned between silicon source 13 and substrate 1 during the initial stage of the sputtering procedure. Means, not shown, are provided for removing this shutter during the deposition.

It has been found to be preferable to produce a magnetic field substantially perpendicular to the respective planes of the cathode and substrate so as to confine the plasma formed during sputtering process whereby higher rates of deposition are achieved. This magnetic field may be provided in any suitable manner, such as by placing coils 30 and 31 surrounding the cathode and substrate. Suitable leads 32 connecting the coils to a source of electric current, not shown, permit the desired magnetic field to be generated within the deposition chamber 40.

Conduit 41 is connected to a vacuum pump, not shown, through which the deposition chamber may be evacuated. Conduit 42 is connected to a source of gas which is admitted through valve 43 into the deposition chamber 40. The gas is preferably pure nitrogen or a gas containing nitrogen or a nitrogen compound which yields sufficient nitrogen during glow discharge to react with the sputtered material from source 13 to form a nitride layer on the surface of substrate 10. Mixtures of nitrogen with an inert gas, such as argon, may be employed.

Cathode 14 is connected through coaxial lead 15 to any suitable source of RF power. In one embodiment, this power supply comprises an RF generator 50, impedance matching circuit 51, and DC blocking capacitor 52.

In a typical deposition, chamber 40 is evacuated to remove contaminants, and nitrogen or other nitrogen-supplying gas is bled in through valve 43 and conduit 42. For example, when pure nitrogen is employed, system pressures can be determined between 0.5 micron and 20 microns. The RF generator 50 is actuated, and, illustratively, may provide a power in the range of about 400 watts and a current having a frequency of about 13.6 megacycles. System pressures are maintained so as to at least sustain the discharge.

It is preferable to sputter-clean the source 13 for about a half-hour prior to actual deposition. During sputter-cleaning, shutter 20 is maintained in place to protect the surface of substrate 10.

Having completed the sputter-cleaning, the shutter 20 is removed; and a thin film of silicon nitride, or aluminum nitride when source 13 is formed of aluminum, is deposited on the surface of substrate 10. During deposition, the substrate is preferably maintained at a temperature of 300° C. or more.

During the deposition, coils 30 and 31 are provided with a current of about 3 amperes which generates a magnetic field having a strength of about 20 oersteds per ampere perpendicular to the plane of the substrate to confine the plasma.

Under these conditions, the plasma, thus produced, bombards the surface of the source 13 so as to dislodge particles of material. It is not clear whether the dislodged material immediately reacts with the nitrogen or does so on the surface of the substrate. In either case, a continuous, uniform film of nitride is deposited. Deposition rates of about one-half micron per hour for silicon nitride and one-third micron per hour for aluminum nitride are achieved under the conditions of the preceding example.

Silicon nitride films formed according to the described procedure have been found to have breakdown voltages of up to about 95 volts for a film thickness of 13,000 A. The dielectric constant of such films is on the order of 7.3.

The resulting silicon nitride films exhibit remarkable resistance to common etchants used in the manufacture of integrated circuits. The results of contacting silicon nitride films produced according to the present invention with various etchants are reported in the following table.

TABLE

| Composition: | Results |
|---|---|
| Concentrated hydrofluoric acid | No attack. |
| Concentrated hydrogen peroxide solution | Do. |
| Concentrated hydrogen peroxide and sodium hydroxide solution | Do. |
| Concentrated hydrofluoric acid and concentrated nitric acid | No attack. Although the film remains intact there is a slight change in color. |

Aluminum nitride films formed according to the described procedure have been found to have a breakdown voltage in excess of 30 volts for a film thickness of approximately 2000 A. The dielectric constant of such films is in the order of 11.1 and have a resistivity greater than $4\times10^{12}$ 52 cm. Also, there was no measurable change in the index of refraction where exposed to air for 30 minutes or forming gas for one hour at 700° C.

The resulting aluminum nitride films exhibit remarkable resistance to common etchants used in the manufacture of integrated circuits. The results of contacting aluminum nitride films produced according to the present invention with various etchants are reported in the following table:

TABLE

| Composition: | Results |
|---|---|
| Water | No wetting after immersion for 30 hours. |
| Concentrated HF | Less than 180 A./minute. |
| Dilute HF | Less than 800 A./minute. |
| 50% HCl | 1 minute—no attack. |
| 50% $HNO_3$ | 1 minute—no attack. |
| NaOH | Readily attacked. |

Figure 2A:
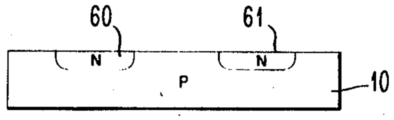
FIG. 2 is a side-sectional, edge view of an insulated-gate field effect transistor device incorporating an insulating film produced in accordance with the invention.
Figure 2B:
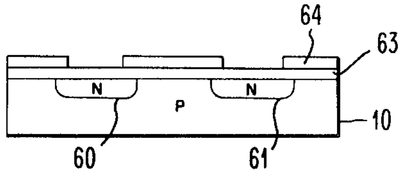
Figure 2C:
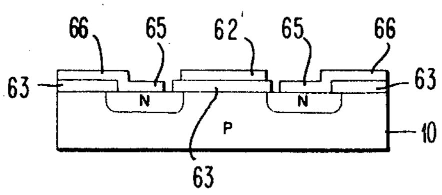

One manner in which a thin insulating layer of silicon nitride or aluminum nitride can be employed in solid state electrical devices, for example, in an insulated-gate filed effect transistor, is shown in FIGS. 2A, 2B, and 2C wherein such thin nitride layer is employed as an insulating film between a semiconductor wafer and a metallic pattern so as to define a metal-insulator-semiconductor structure. As shown, substrate, or wafer, 10 formed of semiconductor material, e.g., P-type silicon, is initially subjected to a diffusion process whereby spaced regions of opposite-conductivity type are formed to define source and drain electrodes 60 and 61. Conventionally, a thin pattern of silicon dioxide ($SiO_2$), not shown, is formed over the surface of wafer 10 as a mask for diffusing source and drain electrodes 60 and 61. For example, such silicon dioxide diffusion mask can be formed by exposing substrate 10 at approximately 1250° C. to an atmosphere of either oxygen ($O_2$), oxygen and water vapor ($O_2+H_2O$), or carbon dioxide ($CO_2$) for a time sufficient to be formed in a thickness of approximately 5000 A. When formed, conventional photolithographic techniques are employed to define "diffusion windows" for exposing surface portions of substrate 10 wherein source and drain diffusions 60 and 61 are to be effected. Substrate 10 is then heated at a temperature ranging between 1100° C. and 1250° C. in a reactive atmosphere, e.g., phosphorus pentoxide ($P_2O_5$), to form the N-type source and drain diffusions 60 and 61. Such fabrication steps are more particularly described in the G. Cheroff et al. patent application entitled "Method for Fabricating Insulated-Gate Field Effect Transistors Having Controlled Operating Characteristics," Ser. No. 468,481, which was filed on June 30, 1965 and assigned to a common assignee.

To complete the structure of the insulated-gate field effect transistor, a gate electrode 62 (c.f., FIG. 2C) is insulated from and registered in electrical-field applying relationship with the narrow surface portion of substrate 10 intermediate source and drain diffusions 60 and 61. The surface portion of substrate 10 intermediate source and drain diffusions 60 and 61 defines a channel along which conduction is field-modulated by appropriate biasing of gate electrode 62. Prior to gate metallization, the substrate 10 is immersed in a suitable etchant, e.g., buffered hydrofluoric acid (HF), to remove the silicon dioxide diffusion mask and expose the surface of substrate 10.

The substrate is then mounted in a system of the type described in FIG. 1 and a thin insulating layer 63 of silicon nitride or, alternatively, of aluminum nitride is deposited over the entire surface of substrate 10. A layer of photoresist material 64 is formed over the surface of the thin insulating layer 63 and selectively reacted. As shown in FIG. 2B, photoresist layer 64 is reacted such that, when developed, at least portions of the substrate surface defined by source and drain diffusions 60 and 61 are exposed. The resulting structure is then subjected to an ion etching, or bombardment, whereby openings 65 are cut into thin insulating layer 63 so as to expose the surfaces of source and drain diffusions 60 and 61. For example, openings 65 can be formed by radio frequency sputtering techniques as described in "Sputtering of Dielectrics by High-Frequency Fields," by G. S. Anderson et al., Journal of Applied Physics, vol. 33, No. 10, October 1962, pages 2991 through 2992 and, also, "RF Sputtering of Insulators," by P. D. Davidse et al., as presented at the Third International Vacuum Congress, at Stuttgart, Germany, June 28 through July 2, 1965. In the case of aluminum nitride, sodium hydroxide (NaOH) can be used as the etchant to define openings 65. Portions of photoresist layer 64 remaining subsequent to ion etching are removed by an appropriate solvent. The structure of the field effect transistor is then completed by a metallization step whereby gate conductor 62 and also electrical conductors 66 to source and drain diffusions 60 and 61 are made. For example, a thin layer of aluminum can be formed over the entire surface of insulating layer 63 and with openings 65 to contact source and drain diffusions 60 and 61. Appropriate photolithographic techniques are then employed to define particular metallic patterns which form gate electrode 62 and also electrical conductors 66. In such metal-insulator-semiconductor structure, thin layer 63 of silicon nitride provides very effective insulation between substrate 10 and the metallized patterns.

Also, in the described diffusion step to form source and drain diffusions 60 and 61, silicon nitride or aluminum nitride can be utilized as a diffusion masking material. For example, the use of a silicon nitride pattern deposited by pyrolytic deposition techniques as a diffusion mask has been described in patent application Ser. No. 629,338, filed on Feb. 8, 1967 in the name of Veu T. Doo as assigned to a common assignee. Also, silicon nitride and aluminum nitride formed according to the described procedure are suitable masking materials. For example, these layers of silicon nitride and aluminum nitride of approximately 2000 A. and formed according to the described procedure are effective to mask gallium, phosphorus, boron, etc. at elevated temperatures, e.g. in excess of 800° C., for extended periods, e.g. in excess of 16 hours.

While the thin insulating films of the present invention have been described as being deposited onto the surface of a silicon substrate, it will be apparent that the use of such films is not so limited. For example, such films can be employed in any metal-insulator-semiconductor or any metal-insulator-metal structure.

While the invention has been particularly shown and described with reference to a preferred embodiment thereof, it will be understood by those skilled in the art that various changes in form and details may be made therein without departing from the spirit and scope of the invention.

What is claimed is:

1. The method of depositing an improved thin insulating film comprising the steps of:

positioning a substrate and a source of material selected from the group consisting of aluminum and silicon in an evacuated chamber, introducing a nitrogen-containing atmosphere in said chamber so as to establish a pressure in said chamber in the range of less than approximately 20 microns, generating a plama containing said material and nitrogen in said chamber, said plasma being stimulated by radio frequency energy, and contacting said substrate with said plasma, said material and said nitrogen being reacted to form a thin insulating film on the surface of said substrate.

2. The method of claim 1 wherein said material is silicon.

3. The method of claim 1 wherein said material is aluminum.

4. The method of claim 1 wherein said substrate is a body of semiconductor material.

5. The method of claim 1 including a further step of heating said substrate in excess of 300° C. while contacted with said plasma.

6. The method of claim 1 including the further step of producing a magnetic field directed substantially perpendicular to said substrate so as to confine said plasma.

7. The method of claim 1 wherein said nitrogen containing atmosphere is a mixture of nitrogen and an inert gas.

8. The method of claim 1 wherein said nitrogen containing atmosphere is pure nitrogen.

9. The method of claim 1 including the further step of applying said radio frequency energy across said source and said substrate.

10. The method of claim 9 including the further step of controlling said radio frequency energy applied across said source and said substrate to be in the range of 400 watts and having a frequency in the range of 13.6 megacycles.

11. The method of claim 9 wherein DC current across said source and said substrate is substantially zero.

References Cited

UNITED STATES PATENTS

| | | | |
|---|---|---|---|
| 3,108,900 | 10/1963 | Papp | 117—93.1 |
| 3,233,137 | 2/1966 | Anderson et al. | 313—201 |
| 3,287,243 | 11/1966 | Ligenza | 204—192 |
| 3,347,772 | 10/1967 | Laegreid et al. | 204—298 |

OTHER REFERENCES

Kay, Eric: "Magnetic Field Effects on an Abnormal Truncated Glow Discharge and Their Relation to Sputtered Thin Film Growth," San Jose Res. Lab., IBM, Journal of Applied Physics, vol. 34, No. 4, p. 1, April 1963, p. 760.

ALFRED L. LEAVITT, Primary Examiner

A. GRIMALDI, Assistant Examiner

U.S. Cl. X.R.

117—DIG. 12, 201; 204—192